US006610456B2

(12) United States Patent
Allen et al.

(10) Patent No.: US 6,610,456 B2
(45) Date of Patent: Aug. 26, 2003

(54) FLUORINE-CONTAINING STYRENE ACRYLATE COPOLYMERS AND USE THEREOF IN LITHOGRAPHIC PHOTORESIST COMPOSITIONS

(75) Inventors: Robert David Allen, San Jose, CA (US); Phillip Joe Brock, Sunnyvale, CA (US); Hiroshi Ito, San Jose, CA (US); Gregory Michael Wallraff, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 09/794,466

(22) Filed: Feb. 26, 2001

(65) Prior Publication Data

US 2002/0164538 A1 Nov. 7, 2002

(51) Int. Cl.$^7$ .......................... G03F 7/039; C08F 220/22
(52) U.S. Cl. .................... 430/270.1; 430/296; 430/325; 430/326; 430/905; 430/907; 526/245; 526/329.2; 526/329.4; 526/341
(58) Field of Search .............................. 430/270.1, 296, 430/323, 325, 326, 905, 907; 526/245, 329.2, 329.4, 341

(56) References Cited

U.S. PATENT DOCUMENTS

| | | | | |
|---|---|---|---|---|
| 4,983,495 A | * | 1/1991 | Tsutsumi et al. | 430/270.1 |
| 5,492,793 A | * | 2/1996 | Breyta et al. | 430/270.1 |
| 6,503,686 B1 | * | 1/2003 | Fryd et al. | 430/270.1 |
| 2001/0010890 A1 | | 8/2001 | Hatakeyama et al. | 430/270.1 |
| 2001/0018162 A1 | | 8/2001 | Hatekeyam et al. | 430/270.1 |
| 2001/0038969 A1 | | 11/2001 | Hatakeyama et al. | 430/270.1 |

OTHER PUBLICATIONS

J. J. Dubowski et al., *Laser Applications in Microelectronic and Optoelectronic Manufacturing IV*, Proceedings of SPIE, SPIE—The International Society for Optical Engineering, Jan. 25–27, 1999, vol. 3618, pp. 413–417.
R. D. Allen et al., *Resolution and Etch Resistance of a Family of 193 nm Positive Resists*, Journal of Photopolymer Science and Technology, vol. 8, No. 4 (1995), pp. 623–636.
N. Abe, *Study of ArF Resist Material in Terms of Transparency and Dry Etch Resistance*, Journal of Photopolymer Science and Technology, vol. 8, No. 4 (1995), pp. 637–642.
H. Ito et al., *Methyl Alpha–Trifluoromethylacrylate, an E–Beam and UV Resist*, IBM Technical Disclosure Bulletin, vol. 24, No. 2, Jul. 1981, p. 991.
H. Ito et al., *Polymerization of Methyl α–(Trifluoromethyl)acrylate and α–(Trifluoromethyl)acrylonitrile and Copolymerization of These Monomers with Methyl Methacrylate*, Macromolecules 1982, vol. 15, pp. 915–920.
H. Ito et al., *Anionic Polymerization of α–(Trifluoromethyl)acrylate*, Copyright 1987 by Elsevier Science Publishing Co., Inc., Recent Advances in Anionic Polymerization, T. E. Hogen–Esch and J. Smid, Editors, pp. 421–430.
Y. Onishi et al., *Acid Catalyzed Resist for KrF Excimer Laser Lithography*, Journal of Photopolymer Science and Technology, vol. 4, No. 3 (1991), pp. 337–340.
R. R. Kunz et al., *Outlook for 157–nm Resist Design*, Part of the SPIE Conference on Advances in Resist Technology and Processing XVI, Santa Clara, California, Mar. 1999, SPIE vol. 3678, pp. 13–23.
M. B. Robin, *Higher Excited States of Polyatomic Molecules*, Bell Laboratories, Murray Hill, New Jersey, Academic Press, New York and London, 1974, vol. 1, pp. 254–265.
C. Sandory et al., *Valence–Shell and Rydberg Transitions in Large Molecules*, S. P. McGlynn et al., (eds.), Photophysics and Photochemistry in the Vacuum Ultraviolet, 1985, pp. 819–840.
"Radical Reactivity of α–Trifluoromethylstyrene," M. Ueda, et al., *J. Polym. Sci.: Part A: Polym. Chem.*, 26, pp. 89–98, 1998.
"Reaction of α–(Trifluoromethyl)styrene with Anionic Initiators," H. Ito, et al., *Macromolecules*, 22, pp. 45–51, 1989.
"Deep UV Resists: Evolution and Status," H. Ito, *Solid State Technol.*, 36(7), pp. 164–173, 1996.
"Environmentally Stable Chemical Amplification Positive Resist: Principle, Chemistry, Contamination Resistance, and Lithographic Feasibility," H. Ito, et al., *J. Photopolym. Sci. Technol.*, 7, pp. 433–448, 1994.
"The Lithographic Performance of an Environmentally Stable Chemically Amplified Photoresist (ESCAP)," W. Conley, et al., *Proc. SPIE*, 2724, pp. 34–60, 1996.
"Hexafluoroacetone in Resist Chemistry: A Versatile New Concept for Materials for Deep UV Lithography," K. J. Przybilla, et al., *Proc. SPIE*, 1672, pp. 500–512, 1992.

\* cited by examiner

*Primary Examiner*—John S. Chu
(74) *Attorney, Agent, or Firm*—Daniel E. Johnson; Dianne E. Reed (57) ABSTRACT

Copolymers prepared by radical polymerization of a fluorine-containing aromatic monomer and an acrylate-based comonomer that may or may not be fluorinated. The polymers are useful in lithographic photoresist compositions, particularly chemical amplification resists. In a preferred embodiment, the polymers are substantially transparent to deep ultraviolet (DUV) radiation, i.e., radiation of a wavelength less than 250 nm, including 157 nm and 248 nm radiation, and are thus useful in DUV lithographic photoresist compositions. A method for using the composition to generate resist images on a substrate is also provided, i.e., in the manufacture of integrated circuits or the like.

56 Claims, 1 Drawing Sheet

FIG. 1

FLUORINE-CONTAINING STYRENE ACRYLATE COPOLYMERS AND USE THEREOF IN LITHOGRAPHIC PHOTORESIST COMPOSITIONS

TECHNICAL FIELD

This invention relates generally to the fields of polymer chemistry, lithography, and semiconductor fabrication. More specifically, the invention relates to novel aromatic polymers, particularly fluorine-containing styrene acrylate copolymers, which are useful in lithographic photoresist compositions, particularly chemical amplification photoresist compositions including ultraviolet, electron-beam, and x-ray photoresists.

BACKGROUND

There is a desire in the industry for higher circuit density in microelectronic devices made using lithographic techniques. One method of increasing the number of components per chip is to decrease the minimum feature size on the chip, which requires higher lithographic resolution. This has been accomplished over the past twenty years by reducing the wavelength of the imaging radiation from the visible (436 nm) down through the ultraviolet (365 nm) to the deep ultraviolet (DUV) at 248 nm. Development of commercial lithographic processes using ultra-deep ultraviolet radiation, particularly 193 nm, is now becoming of interest. See, for example, Allen et al. (1995), "Resolution and Etch Resistance of a Family of 193 nm Positive Resists," *J. Photopolym. Sci. and Tech.* 8(4):623–636, and Abe et al. (1995), "Study of ArF Resist Material in Terms of Transparency and Dry Etch Resistance," *J. Photopolym. Sci. and Tech.* 8(4):637–642. The resists proposed for use with 193 nm imaging radiation do not appear suitable for use with 157 nm radiation due to their poor transparency at the 157 nm wavelength.

Certain attempts have been made to develop 157 nm resists, for example using heavily fluorinated materials such as polytetrafluoroethylene (e.g., Teflon AF®; see Endert et al. (1999) *Proc. SPIE-Int. Soc. Opt. Eng*, 3618:413–417) or hydridosilsesquioxanes (see U.S. Pat. No. 6,087,064 to Lin et al.). These materials do not, however, have the requisite reactivity or solubility characteristics. The challenge in developing chemically amplified resists for 157 nm lithography is in achieving suitable transparency in polymers that have acid-labile functionalities and developed with industry standard developers in either exposed or unexposed areas depending on whether the resist is positive or negative.

Polymers prepared from trifluoromethyl-substituted acrylates have been described. See, for example, Ito et al. (1981), "Methyl Alpha-Trifluoromethylacrylate, an E-Beam and UV Resist," *IBM Technical Disclosure Bulletin* 24(4):991, Ito et al. (1982) *Macromolecules* 15:915–920, which describes preparation of poly(methyl α-trifluoromethylacrylate) and poly(α-trifluoromethylacrylonitrile) from their respective monomers, and Ito et al. (1987), "Anionic Polymerization of α-(Trifluoromethyl)Acrylate," in *Recent Advances in Anionic Polymerization*, T. E. Hogen-Esch and J. Smid, Eds. (Elsevier Science Publishing Co., Inc.), which describes an anionic polymerization method for preparing polymers of trifluoromethylacrylate. Willson et al., *Polymer Engineering and Science* 23(18):1000–1003, also discuss poly(methyl α-trifluoromethylacrylate) and use thereof in a positive electron beam resist. However, none of these references discloses the utility of trifluoromethyl-substituted acrylate polymers in chemical amplification resists.

Polymers derived from poly(4-hydroxystyrene), or "PHOST", have been favored for work at 248 nm, since the phenolic structure provides dry etch stability, aqueous base solubility, and optical transparency at 248 nm. (See "Deep UV resists: evolution and status", H. Ito, *Solid State Technol.*, 36(7), pp. 164–173, 1996.) One important example is the "ESCAP" resist, which is formed from a copolymer of hydroxystyrene ("HOST") and t-butyl acrylate (TBA). (See "Environmentally stable chemical amplification positive resist: principle, chemistry, contamination resistance, and lithographic feasibility", H. Ito et al., *J. Photopolym. Sci. Technol.*, 7, pp. 433–448, 1994; and "The lithographic performance of an environmentally stable chemically amplified photoresist (ESCAP)", W. Conley et al., *Proc. SPIE*, 2724, pp. 34–60, 1996.) The ESCAP resist, or poly(HOST-co-TBA), has become foundational to 248 nm photolithography. Poly(4-(1-hydroxy-2,2,2-trifluoro-1-trifluoromethyl) ethylstyrene), or PSHFI, has been suggested as a replacement for PHOST for 248 nm lithography (see "Hexafluoroacetone in resist chemistry: a versatile new concept for materials for deep UV lithography", K. J. Przybilla et al., *Proc. SPIE*, 1672, pp. 500–512, 1992), but commercial resist products have not yet emerged.

Styrenic polymers have not been favored for work at 193 nm because of the absorption arising from the aromatic group. For the same reason, it has been commonly believed that aromatic polymers would not find photolithography applications at 157 nm: The optical densities of PHOST and ESCAP at this wavelength are 6.5/micron and 7/micron, respectively. Accordingly, the search for resists for use at 157 nm has focused on other polymers such as aliphatic polymers, which present challenging problems of their own, e.g., poor etch resistance.

SUMMARY OF THE INVENTION

Accordingly, it is a primary object of the invention to address the above-described need in the art by providing novel fluorine-containing styrene acrylate copolymers suitable for use in lithographic photoresist compositions.

It is another object of the invention to provide a lithographic photoresist composition containing a fluorine-containing styrene acrylate copolymer.

It is still another object of the invention to provide such a composition wherein the fluorine-containing styrene acrylate copolymer is relatively transparent in certain wavelength regions in the deep ultraviolet spectrum (i.e., below 250 nm), and in particular, at 248 nm and 157 nm.

It is yet another object of the invention to provide such a composition wherein the fluorine-containing styrene acrylate copolymer is a copolymer of a styrene monomer substituted with a fluorine-containing moiety and a fluorinated or non-fluorinated acrylic monomer.

It is still another object of the invention to provide a method for generating a resist image on a substrate using a photoresist composition as described herein.

It is a further object of the invention to provide a method for forming a patterned material structure on a substrate by transferring the aforementioned resist image to the material through, for example, etching.

Additional objects, advantages and novel features of the invention will be set forth in part in the description which follows, and in part will become apparent to those skilled in the art upon examination of the following, or may be learned by practice of the invention.

In one aspect, then, the present invention relates to a fluorine-containing styrene acrylate copolymer prepared by copolymerization of at least one aromatic monomer having the structure of formula (I)

(I)

and at least one monomer having the structure of formula (II)

(II)

wherein:

m is zero or 1;

n is an integer in the range of zero to 4 inclusive;

$R_1$ is H, F, lower alkyl, or fluorinated lower alkyl;

$R_2$ is alkyl, fluorinated alkyl, hydroxyl, alkoxy, fluorinated alkoxy, halogen, or cyano;

$R_3$ is a fluorinated alkyl;

$R_4$ is H, alkyl, or fluorinated alkyl; where $R_8$ is H or alkyl, $R_9$ is alkyl, and $R_{10}$ is alkyl or alkoxy;

$R_6$ is H, F, lower alkyl, or fluorinated lower alkyl;

$R_7$ is selected from the group consisting of H, an acid-labile moiety optionally substituted with one or more fluorine atoms, and an acid inert moiety optionally substituted with one or more fluorine atoms;

L is a hydrocarbylene linking group optionally substituted with one or more fluorine atoms; and Ar is an aromatic moiety.

In another aspect, the invention relates to a lithographic photoresist composition comprising a fluorine-containing styrene acrylate copolymer as described above and a photosensitive acid generator (also referred to herein as a "photoacid generator," a "PAG," or a "radiation-sensitive acid generator").

One aspect of the invention also relates to the use of the resist composition in a lithography method. The process involves the steps of (a) coating a substrate (e.g., a ceramic, metal or semiconductor substrate) with a film comprising a radiation-sensitive acid generator and a copolymer as provided herein; (b) exposing the film selectively to a predetermined pattern of radiation to form a latent image therein; and (c) developing the image using a suitable developer composition. The radiation may be ultraviolet, electron beam or x-ray. Ultraviolet radiation is preferred, particularly deep ultraviolet radiation at 157 nm or 248 nm, or even extreme ultraviolet radiation at, for example, 13 nm. The pattern from the resist structure may then be transferred to the underlying substrate. Typically, the transfer is achieved by reactive ion etching or some other etching technique. Thus, the compositions provided herein and the resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

Another aspect of the invention is a method of forming a patterned material structure on a substrate, in which the material is selected from the group consisting of semiconductors, ceramics and metals. The method includes providing a substrate having a surface comprised of the material. A resist composition is applied to the substrate surface to form a resist layer over the material, in which the resist composition comprises a copolymer as provided herein and a radiation-sensitive acid generator. The resist is patternwise exposed to radiation, whereby acid is generated by the radiation-sensitive acid generator in exposed regions of the resist layer. The resist is contacted with a developer solution, whereby the developed regions of the resist layer reveal a patterned resist structure, and the resist structure pattern is transferred to the material by etching into the material through spaces in the resist structure.

DETAILED DESCRIPTION OF THE INVENTION

Definitions

Before describing the present invention in detail, it is to be understood that this invention is not limited to specific compositions, components or process steps, as such may vary. It is also to be understood that the terminology used herein is for the purpose of describing particular embodiments only, and is not intended to be limiting.

It must be noted that, as used in this specification and the appended claims, the singular forms "a," "an" and "the" include plural referents unless the context clearly dictates otherwise. Thus, for example, reference to "a monomer" includes a combination of two or more monomers that may or may not be the same, a "photoacid generator" includes a mixture of two or more photoacid generators, and the like.

In describing and claiming the present invention, the following terminology will be used in accordance with the definitions set out below.

The term "alkyl" as used herein refers to a branched or unbranched saturated hydrocarbon group of 1 to 24 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. The term "lower alkyl" intends an alkyl group of 1 to about 8 carbon atoms, typically 1 to about 6 carbon atoms, and the term "lower alkyl ester" refers to an ester functionality —C(O)O—R wherein R is lower alkyl.

The term "alkylene" as used herein refers to a difunctional branched or unbranched saturated hydrocarbon group of 1 to 24 carbon atoms, such as methylene, ethylene, n-propylene, n-butylene, n-hexylene, decylene, tetradecylene, hexadecylene, and the like. The term "lower alkylene" refers to an alkylene group of 1 to about 8 carbon atoms, typically 1 to about 6 carbon atoms.

The term "alkoxy" as used herein intends an alkyl group bound through a single, terminal ether linkage; that is, an "alkoxy" group may be defined as —O-alkyl where alkyl is as defined above. A "lower alkoxy" group intends an alkoxy group containing 1 to 8, typically 1 to 6, carbon atoms.

The term "alkenylene" as used herein refers to a difunctional branched or unbranched hydrocarbon group of 2 to 24 carbon atoms containing at least one carbon-carbon double bond, such as ethenylene, n-propenylene, n-butenylene, n-hexenylene, and the like. The term "lower alkenylene" refers to an alkylene group containing 1 to 8, typically 1 to 6, carbon atoms.

The term "aromatic" as used herein, and unless otherwise specified, refers to an aromatic moiety containing 1 to 5 aromatic rings. For aromatic groups containing more than one aromatic ring, the rings may be fused (e.g., as in a naphthyl substituent) or linked (e.g., as in a biphenyl substituent). Aromatic groups are optionally substituted with one or more inert, nonhydrogen substituents per ring; suitable "inert, nonhydrogen" substituents include, for example, halo, haloalkyl (preferably halo-substituted lower alkyl), alkyl (preferably lower alkyl), alkoxy (preferably lower alkoxy), and the like. Unless otherwise indicated, the term "aromatic" is also intended to include heteroaromatic moieties, i.e., aromatic heterocycles. Generally, although not necessarily, the heteroatoms will be nitrogen, oxygen or sulfur.

The term "hydrocarbyl" is used in its conventional sense to refer to a hydrocarbon group containing carbon and hydrogen, and may be aliphatic, alicyclic or aromatic, or may contain a combination of aliphatic, alicyclic and/or aromatic moieties. Aliphatic and alicyclic hydrocarbyl may be saturated or they may contain one or more unsaturated bonds, typically double bonds. The hydrocarbyl substituents herein generally contain 1 to 24 carbon atoms, more typically 1 to 12 carbon atoms, and may be substituted with various substituents and functional groups, or may be modified so as to contain ether, thioether, —NH—, —NR, —C(O)—, —C(O)—O— and/or other linkages.

The term "hydrocarbylene" refers to a difunctional hydrocarbyl linkage.

The term "fluorinated" refers to replacement of a hydrogen atom in a molecule or molecular segment with a fluorine atom, and includes perfluorinated moieties. The term "perfluorinated" is also used in its conventional sense to refer to a molecule or molecular segment wherein all hydrogen atoms are replaced with fluorine atoms. Thus, a "fluorinated" methyl group encompasses —CH$_2$F and —CHF$_2$ as well as the "perfluorinated" methyl group —CF$_3$.

The term "styrene" is used in a general sense to refer to styrene monomers and styrene monomer units per se as well as analogous monomers and monomer units comprised of bicyclic and polycyclic aromatic structures in lieu of styrene's phenyl substituent.

The terms "acid-labile" and "acid-cleavable" are used interchangeably to refer to a substituent that is cleaved and thereby released from a molecule upon contact with photogenerated acid.

Analogously, the term "acid-inert" refers to a substituent that is not cleaved or otherwise chemically modified upon contact with photogenerated acid.

"Optional" or "optionally" means that the subsequently described event or circumstance may or may not occur, and that the description includes instances where said event or circumstance occurs and instances where it does not. For example, the phrase "optionally substituted lower alkyl" means that a lower alkyl moiety may or may not be substituted and that the description includes both unsubstituted lower alkyl and lower alkyl where there is substitution.

The term "polymer" is used to refer to a chemical compound that comprises linked monomers, and that may be linear, branched, or crosslinked.

The terms "photogenerated acid" and "photoacid" are used interchangeably herein to refer to the acid that is created upon exposure of the present compositions to radiation, i.e., as a result of the radiation-sensitive acid generator in the compositions.

The term "substantially transparent" as used to describe a polymer that is "substantially transparent" to radiation of a particular wavelength refers to a polymer that has an absorbance of less than about 5.0/micron, preferably less than about 4.0/micron, most preferably less than about 3.5/micron, at a selected wavelength.

For additional information concerning terms used in the field of lithography and lithographic compositions, reference may be had to *Introduction to Microlithography*, Eds. Thompson et al. (Washington, D.C.: American Chemical Society, 1994).

The Fluorinated Styrene Copolymer

The fluorinated styrene copolymer is prepared by copolymerization of at least one monomer having the structure (I)

and at least one monomer having the structure (II):

wherein the various substituents are as follows.

In monomer (I), R$_1$ is generally selected from the group consisting of H, F, lower alkyl and fluorinated lower alkyl. Most preferred for polymerization are formula (I) monomers wherein R$_1$ is H. If R$_1$ is lower alkyl or fluorinated lower alkyl, then methyl and fluorinated methyl, particularly trifluoromethyl, are preferred.

Ar is an aromatic moiety, and may be monocyclic, bicyclic or polycyclic, if polycyclic, typically comprised of not more than about 5 aromatic rings. Bicyclic and polycyclic structures may be fused or linked. For example, bicyclic structures may be biphenyl, a fused substituent naphthyl, a linked substituent Generally, however, Ar will be phenyl, such that the monomer is a styrene analog.

As indicated, the aromatic moiety Ar may or may not be substituted. That is, "n" $R_2$ substituents are bound to Ar, where n is an integer in the range of zero to 4 inclusive, and $R_2$ is a non-hydrogen substituent. The case n is zero is preferred. (It is understood that when n is zero, the aromatic Ar is unsubstituted, i.e., only hydrogen atoms are bound to the available carbon atoms of the cyclic structure.) Suitable non-hydrogen $R_2$ substituents include, by way of example, alkyl, fluorinated alkyl, hydroxyl, alkoxy, fluorinated alkoxy, halogen, and cyano. Optimal halogen substituents are fluorine atoms, and if $R_2$ is alkyl, fluorinated alkyl, alkoxy or fluorinated alkoxy, the substituents will generally be lower alkyl, fluorinated lower alkyl, lower alkoxy or fluorinated lower alkoxy, i.e., containing 1 to about 8 carbon atoms, preferably 1 to about 6 carbon atoms. Most preferred substituents are those that lower the optical absorbance of the copolymer at the wavelength of interest, i.e., at 157 nm. If Ar is substituted, as noted above, it can contain up to 4 non-hydrogen substituents. However, substituted Ar moieties will generally be substituted with only 1 or 2 substituents, preferably 1 substituent.

The linker L may or may not be present; that is, m may be zero or 1. If m is 1, i.e., if L is present, it will generally comprise a hydrocarbylene linking moiety. Preferred linking moieties are alkylene and alkenylene linkages, optionally substituted with one or more hydrocarbyl or non-hydrocarbyl substituents, e.g., alkyl groups, fluorinated alkyl groups, and halogen atoms, preferably lower alkyl groups, fluorinated lower alkyl groups, and fluorine atoms, and may additionally contain one or more non-hydrocarbylene linkages such as ether and thioether linkages. In the latter case, however, the oxygen or sulfur atom should not be immediately adjacent to —$CR_3R_4$—. Thus, preferred linking moieties include, but are not limited to, lower alkylene, fluorinated lower alkylene, lower alkyl-substituted lower alkylene, mono(trifluoromethyl)-substituted lower alkylene, and di(trifluoromethyl)-substituted lower alkylene. Preferred alkylene and alkenylene linkages are lower alkylene and lower alkenylene, preferably although not necessarily fluorinated, with linkages containing only 1 or 2 carbon atoms most preferred. Such linkages include, by way of example, —$CH_2$—, —$CH_2$—$CH_2$—, —CH=CH—, —$CF_2$—, —$CF_2$—$CF_2$—, —CF=CF—, —$OCH_2$—, and —$SCH_2$—.

$R_3$ is a fluorinated alkyl group, preferably a fluorinated lower alkyl group, i.e., containing 1 to about 8 carbon atoms, optimally 1 to about 6 carbon atoms. A trifluoromethyl groups is particularly preferred at the $R_3$ position.

$R_4$ is H, alkyl or fluorinated alkyl, if alkyl or fluorinated alkyl, preferably lower alkyl or fluorinated lower alkyl (i.e., alkyl or fluorinated alkyl of 1 to about 8, preferably 1 to about 6, carbon atoms). In a particularly preferred embodiment, $R_4$ is trifluoromethyl or methyl, with trifluoromethyl most preferred.

$R_5$ is H, alkyl, protected hydroxyl, —C(O)$R_8$, —$CH_2$—C(O)$R_8$, —C(O)O$R_9$, or —Si$R_{10}$ where $R_8$ is H or alkyl, $R_9$ is alkyl, and $R_{10}$ is alkyl or alkoxy. When $R_5$ is —C(O)$R_8$ or —$CH_2$—C(O)$R_8$, preferred $R_8$ moieties are alkyl, typically lower alkyl. Similarly, $R_9$ is preferably lower alkyl, and $R_{10}$ is preferably lower alkyl or lower alkoxy, optimally lower alkyl. When $R_5$ is a hydroxyl-protecting group (i.e., —$OR_5$ is a protected hydroxyl group), it will generally derive from reaction of the unprotected hydroxyl group with a suitable protecting reagent. In this case, $R_5$ will generally be tertiary alkyl, e.g., t-butyl, or a cyclic or alicyclic substituent (generally $C_7$–$C_{12}$) with a tertiary attachment point such as adamantyl, norbornyl, isobornyl, 2-methyl-2-adamantyl, 2-methyl-2-isobornyl, 2-methyl-2-tetracyclododecenyl, 2-methyl-2-dihydrodicyclopentadienyl-cyclohexyl or 1-methylcyclohexyl. Most preferably, however, $R_5$ is H.

In monomer (II), $R_6$ is selected from the group consisting of H, F, lower alkyl, and fluorinated lower alkyl. When the copolymer is employed in a 157 nm resist, $R_6$ is preferably fluorinated lower alkyl, more preferably trifluoromethyl. When the copolymer is used in an extreme ultraviolet resist (e.g., 13 nm) or in a 248 nm resist, $R_6$ is preferably H, methyl or trifluoromethyl.

$R_7$ is H, an acid-cleavable moiety optionally substituted with one or more fluorine atoms, or an acid-inert moiety optionally substituted with one or more fluorine atoms. Acid-inert $R_7$ moieties include, by way of example, fluorinated alkyl groups, with fluorinated lower alkyl groups preferred. Acid-inert moieties also include alkyl and cycloalkyl groups that do not contain a tertiary attachment point. Acid-cleavable $R_7$ moieties include tertiary alkyl, e.g., t-butyl, or a cyclic or alicyclic substituent (generally $C_7$–$C_{12}$) with a tertiary attachment point such as adamantyl, norbornyl, isobornyl, 2-methyl-2-adamantyl, 2-methyl-2-isobornyl, 2-methyl-2-tetracyclododecenyl, 2-methyl-2-dihydrodicyclopentadienyl-cyclohexyl or 1-methylcyclohexyl. $R_7$ may also be wherein x is in the range of 1 to 8 inclusive, L' is a hydrocarbylene group optionally substituted with one or more fluorine atoms, y is zero (i.e., L' is not present) or 1, $R_{11}$ is optionally substituted hydrocarbyl, typically alkyl or fluorinated alkyl, preferably lower alkyl or fluorinated lower alkyl, and $R_{12}$ and $R_{13}$ are lower alkyl or are linked to form a five-or six-membered heterocyclic ring that may or may not contain an additional heteroatom and/or a carbonyl moiety.

Other examples of acid-cleavable groups are set forth in U.S. Pat. No. 4,491,628 to Ito et al., entitled "Positive- and Negative-Working Resist Compositions with Acid-Generating Photoinitiator and Polymer with Acid Labile Groups Pendant from Polymer Backbone," and in the *Hand-* book of *Microlithography, Micromachining, and Microfabrication*, Vol. 1: *Microlithography*, Ed. P. Raj-Coudhury, p. 321 (1997). Still other suitable acid-cleavable groups may be found in U.S. Pat. No. 5,679,495 to Yamachika et al. or in the pertinent literature and texts (e.g., Greene et al., Protective Groups in Organic Synthesis, $2^{nd}$ Ed. (New York: John Wiley & Sons, 1991)).

Examples of structure (II) monomers that are preferred include, but are not limited to, the following:

The copolymer may be prepared from one or more monomers having the structure of formula (I) and from one or more monomers having the structure of formula (II). For example, the copolymer may be prepared from two monomers having the structure of formula (I) and two monomers having the structure of formula (II). Furthermore, the copolymer may also be prepared by using one or more additional monomers not having the structure of formula (I) of formula (II). These additional monomers will be addition polymerizable monomers, preferably radically copolymerizable vinyl monomers, and may be advantageously substituted with groups that lower absorbance at 157 nm. Additional acid-inert monomers may or may not be substituted with fluorine. Fluorine-containing acid-inert monomers include $CF_2=CF_2$, $(CF_3)_2C=CF_2$, $(CF_3)_2C=C(CF_3)_2$, $(CF_3)CH=CH(CF_3)$, α-trifluoromethylstyrene (TFMST), and α-trifluoromethylacrylonitrile (TFMAN).

TFMST:

TFMAN:

Acid-inert monomers that do not contain fluorine include, for example, styrene, acrylonitrile, and methacrylonitrile.

Additional monomers that can be copolymerized along with structure (I) and structure (II) monomers, or that may serve as structure (II) monomers, include acrylic acid, methacrylic acid, or trifluoromethacrylic acid, which may be advantageously incorporated to enhance the development and adhesion properties of the resist. The copolymer may also comprise other suitable monomer units such as hydroxystyrene to enhance development and etch resistance, or a silicon-containing monomer unit (e.g., a silicon-containing acrylate, methacrylate or styrene) to enhance oxygen plasma etch resistance for bilayer applications. In general, suitable comonomers to be used in addition to those of formulae (I) and (II), or that can serve as structure (II) monomers, include, but are not limited to, the following ethylenically unsaturated polymerizable monomers: acrylic and methacrylic acid esters and amides, including alkyl acrylates, aryl acrylates, alkyl methacrylates and aryl methacrylates (for example, methyl acrylate, methyl methacrylate, n-butyl acrylate, n-butyl methacrylate, t-butyl acrylate, t-butyl methacrylate, 2-ethylhexyl methacrylate, benzyl acrylate and N-phenylacrylamide); vinyl aromatics, including unsubstituted styrene and styrene substituted with one or two lower alkyl, halogen or hydroxyl groups (for example, styrene derivatives such as 4-vinyltoluene, 4-vinylphenol, α-methylstyrene, 2,5-dimethylstyrene, 4-t-butylstyrene and 2-chlorostyrene); butadiene; vinyl acetate; vinyl bromide; vinylidene chloride; fluorinated analogs of any of the foregoing, e.g., fluorinated acrylic and methacrylic acid esters (e.g., fluorinated alkyl acrylates, fluorinated aryl acrylates, fluorinated alkyl methacrylates and fluorinated aryl methacrylates); and others readily apparent to one skilled in the art.

The copolymer formed from structures (I) and (II) above is comprised of monomer units having the structure (III)

and monomer units having the structure (IV)

where $R_1$ through $R_7$, Ar, L, m and n are given above. The copolymer may also include one or more additional monomer units, e.g., acid-inert monomer units generated from acid-inert monomers, if such a monomer is included in the polymerization process.

The copolymer may advantageously have molar fractions of the monomer units (III) and (IV) in the range of approximately 0.1 to 0.9 and 0.9 to 0.1, respectively, with the molar fraction of the additional monomer unit(s) in the range of zero to approximately 0.25.

One copolymer which may be synthesized by copolymerization of structure (I) and (II) given above is poly(4-(hexafluorohydroxyisopropyl)styrene-co-t-butyl methacrylate), P(4SHFI-co-TBMA):

P(4SHFI-co-TBMA):

4-(Hexafluorohydroxyisopropyl)styrene (SHFI) was found to readily undergo radical copolymerization with acrylic monomers such as t-butyl acrylate (TBA) and t-butyl methacrylate (TBMA) without protecting the acidic OH group, thereby forming P(4SHFI-co-TBMA). P(4SHFI-co-TBMA) (35 mol % TBMA) was found to have a glass transition temperature $T_g$ of 135° C. and a dissolution rate of 3.5 nm/sec in the industry standard 0.26 N tetramethylammonium hydroxide (TMAH). This same compound had a measured optical density (OD) of 4.1/micron at 157 nm, which is surprisingly low in view of the fact that other aromatic polymers are relatively optically dense at 157 nm; P(4SHFI-co-TBMA) is thus suitable for certain deep-UV, high resolution, high performance photoresist applications. The absorption of P(4SHFI-co-TBMA) can be further reduced by terpolymerizing with fluoroalkyl methacrylate or other fluorine-containing monomers. P(4SHFI-co-TBMA) is advantageously devoid of crosslinking at very high exposures at 157 nm, whereas many conventional resist materials have a tendency to crosslink at this wavelength at moderate to high doses. In particular, P(4SHFI-co-TBMA) does not undergo crosslinking at up to 30 times the clearing dose for polymer dissolution. By way of contrast, many conventional materials undergo crosslinking at about 3 times the clearing dose for polymer dissolution.

Another copolymer having still lower OD at 157 nm is poly(4-(hexafluorohydroxyisopropyl)-styrene-co-t-butyl α-trifluoromethylacrylate), P(4SHFI-co-TBTFMA):

P(4SHFI-co-TBTFMA)

P(4SHFI-co-TBTFMA) may be formed by copolymerizing 4-(hexafluorohydroxyisopropyl)-styrene (SHFI) with t-butyl α-trifluoromethylacrylate (TBTFMA). The use of the TBTFMA structure has been described in the formation of resists in Applicant's copending applications "NORBORNENE FLUOROACRYLATE COPOLYMERS AND PROCESS FOR USE THEREOF" to Hiroshi Ito et al., Ser. No. 09/771,149; "LITHOGRAPHIC PHOTORESIST COMPOSITION AND PROCESS FOR ITS USE" to Phillip Joe Brock et al., Ser. No. 09/771,261; and "SUBSTITUTED NORBORNENE FLUOROACRYLATE COPOLYMERS AND USE THEREOF IN LITHOGRAPHIC PHOTORESIST COMPOSITIONS" to Hiroshi Ito et al., Ser. No. 09/771,262, all of which were filed on Jan. 26, 2001 and are hereby incorporated by reference herein. As with TBMA, TBTFMA undergoes radical copolymerization with SHFI without protecting the acidic OH group, leading to P(4SHFI-co-TBTFMA). P(4SHFI-co-TBTFMA) exhibits surprisingly low absorbance in view of the high absorbance of aromatic polymers at 157 mn: it has an OD of 3.4/micron at this wavelength, which is lower than that of its less-fluorinated counterpart P(4SHFI-co-TBMA). P(4SHFI-co-TBTFMA) containing 25 mol % TBTFMA dissolves at 35 nm/sec in TMAH, and its dissolution rate can be easily adjusted by changing the feed ratio and/or by incorporating a third monomer.

Terpolymerization with a fluorinated third monomer such as a fluoroalkyl methacrylate further reduces the OD at 157 nm. The compound α-trifluoromethylstyrene (TFMST), which does not undergo either radical or anionic homopolymerization (see "Radical reactivity of α-trifluoromethylstyrene", M. Ueda et al., J. Polym. Sci.: Part A: Polym. Chem., 26, pp. 89–98, 1988; and "Reaction of α-(trifluoromethyl)styrene with anionic initiators", H. Ito et al., Macromolecules, 22, pp. 45–51, 1989), nevertheless copolymerizes with SHFI in the presence of TBTFMA to form a terpolymerized analog of P(4SHFI-co-TBTFMA). The use of TFMST can also be expected to improve dry etch resistance. α-Trifluoromethyl-acrylonitrile (TFMAN) is expected to play a role as a third monomer similar to that played by TFMST.

Monomer Synthesis and Polymerization

The present copolymers may be readily synthesized using methods described in the pertinent texts and literature, or as known to those of ordinary skill in the art. Methods for synthesizing representative monomers are described in the examples, as are methods for preparing the fluorinated styrene copolymers. One of ordinary skill in the art will recognize that the experimental methodology described in the examples is applicable to a wide range of monomeric and polymeric structures as encompassed by structural formulae (I), (II), (III) and (IV) herein.

The copolymers provided herein can be prepared by radical copolymerization, using a suitable free radical initiator. The initiator may be any conventional free radical-generating polymerization initiator. Examples of suitable initiators include peroxides such as O-t-amyl-O-(2 ethylhexyl)monoperoxycarbonate, dipropylperoxydicarbonate, and benzoyl peroxide (BPO) as well as azo compounds such as azobisisobutyronitrile (AIBN), 2,2'-azobis(2-amidino-propane)dihydrochloride, and 2,2'-azobis(isobutyramide)dihydrate. The initiator is generally present in the polymerization mixture in an amount of from about 0.2 to 5% by weight of the monomers. The resulting copolymer typically has a number average molecular weight in the range of approximately 500 to 50,000, generally in the range of approximately 1,000 to 15,000.

The Photoacid Generator

The second component of the resist composition is a photoacid generator. Upon exposure to radiation, the photoacid generator generates a strong acid. A variety of photoacid generators can be used in the compositions provided herein. The photosensitive acid generators used in the photoresist compositions provided herein may be any suitable photosensitive acid generator known in the art which is compatible with the other components of the photoresist composition. Examples of preferred photoresist acid generators (PAGs) include, but are not limited to, α-(trifluoromethylsulfonyloxy)-bicyclo[2.2.1]hept-5-ene-2,3-dicarboximide (MDT), onium salts, aromatic diazonium salts, sulfonium salts, diaryliodonium salts and sulfonic acid esters of N-hydroxyamides or -imides, as disclosed in U.S. Pat. No. 4,731,605. Also, a PAG that produces a weaker acid such as dodecane sulfonate of N-hydroxy-naphthalimide (DDSN) may be used. Combinations of PAGs may be used. Generally, suitable acid generators have a high thermal stability (preferably to temperatures greater than 140° C.) so they are not degraded during pre-exposure processing. In addition to MDT and DDSN, suitable sulfonate compounds are sulfonate salts, but other suitable sulfonate PAGs include sulfonated esters and sulfonyloxy ketones. See U.S. Pat. No. 5,344,742 to Sinta et al., and *J. Photopolymer Science and Technology*, 4:337–340 (1991), for disclosure of suitable sulfonate PAGs, including benzoin tosylate, t-butylphenyl α-(p-toluenesulfonyloxy)-acetate and t-butyl α-(p-toluenesulfonyloxy)-acetate. Onium salts are also generally preferred acid generators of compositions provided herein. Onium salts that contain weakly nucleophilic anions have been found to be particularly suitable. Examples of such anions are the halogen complex anions of divalent to heptavalent metals or non-metals, for example, Sb, B, P, and As. Examples of suitable onium salts are aryl-diazonium salts, halonium salts, aromatic sulfonium salts and sulfoxonium salts or selenium salts, (e.g., triarylsulfonium and diaryliodonium hexafluoroantimonates, hexafluoroarsenates, trifluoromethanesulfonates and others). One preferred diaryliodonium salt is iodonium perfluorooctanesulfonate and is disclosed in U.S. Pat. No. 6,165,673 to Breyta et al., "Resist composition with radiation sensitive acid generator", which is hereby incorporated by reference herein. Examples of suitable preferred onium salts can be found in U.S. Pat. Nos. 4,442,197, 4,603,101, and 4,624,912. Other useful acid generators include the family of nitrobenzyl esters, and the s-triazine derivatives. Suitable s-triazine acid generators are disclosed, for example, in U.S. Pat. No. 4,189,323.

Still other suitable acid generators include N-camphorsulfonyloxynaphthalimide, N-pentafluorophenylsulfonyloxynaphthalimide, ionic iodonium sulfonates, e.g., diaryl iodonium (alkyl or aryl) sulfonate and bis-(di-t-butylphenyl)iodonium camphanylsulfonate, perfluoroalkanesulfonates, such as perfluoropentanesulfonate, perfluorooctanesulfonate, perfluoromethanesulfonate; aryl (e.g., phenyl or benzyl) triflates and derivatives and analogs thereof, e.g., triphenylsulfonium triflate or bis-(t-butylphenyl)iodonium triflate; pyrogallol derivatives (e.g., trimesylate of pyrogallol); trifluoromethanesulfonate esters of hydroxyimides, α,α'-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods provided herein will be known to those skilled in the art and/or are described in the pertinent literature.

The Resist Composition

The photoresist composition herein comprises both a fluorinated styrene copolymer as described in detail above and an acid generator, with the polymer representing up to about 99 wt. % of the solids included in the composition, and the photoacid generator representing approximately 0.5–10 wt. % of the solids contained in the composition. Other components and additives (e.g., dissolution modifying additives such as dissolution inhibitors) may also be present. For improved transparency at 157 nm, the dissolution modifying additive is preferably a fluorine-containing material.

For example, a positive photoresist composition may include a dissolution modifying additive, generally although not necessarily a dissolution inhibitor, and a negative photoresist composition will include a crosslinking agent. If dissolution inhibitors and crosslinking agents are present, they will typically represent in the range of about 1 wt. % to 40 wt. %, preferably about 5 wt. % to 30 wt. %, of the total solids.

Suitable dissolution inhibitors will be known to those skilled in the art and/or described in the pertinent literature. Preferred dissolution inhibitors have high solubility in the resist composition and the solvent used to prepare solutions of the resist composition (e.g., propylene glycol methyl ether acetate, or "PGMEA"), exhibit strong dissolution inhibition, have a high exposed dissolution rate, are substantially transparent at the wavelength of interest, may exhibit a moderating influence on $T_g$, strong etch resistance, and display good thermal stability (i.e., stability at temperatures of about 140° C. or greater). Suitable dissolution inhibitors include, but are not limited to, bisphenol A derivatives and carbonate derivatives, for example bisphenol A derivatives wherein one or both hydroxyl moieties are converted to a t-butoxy substituent or a derivative thereof such as a t-butoxycarbonyl or t-butoxycarbonylmethyl group; fluorinated bisphenol A derivatives such as $CF_3$-bisphenol A—$OCH_2(CO)$—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; and cyclic acetal groups such as tetrahydrofuranyl, tetrahydropyranyl, and 2-methoxytetrahydropyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al. (1995) *J. Photopolym. Sci. Technol.*, cited supra); hydroxyl-substituted analogs of such compounds (ibid.); and androstane-17-alkylcarboxylates substituted with 1 to 3 $C_1$–$C_4$ fluoroalkyl carbonyloxy substituents, such as t-butyl trifluoroacetyllithocholate (see, e.g., U.S. Pat. No. 5,580,694 to Allen et al.).

The crosslinking agent used in the photoresist compositions provided herein may be any suitable crosslinking agent known in the negative photoresist art which is otherwise compatible with the other selected components of the photoresist composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible crosslinking agents include: 2,6-bis(hydroxymethyl)-p-cresol and compounds having the following structures:

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Combinations of crosslinking agents may be used.

The remainder of the resist composition is composed of a solvent and may additionally, if necessary or desirable, include customary additives such as dyes, sensitizers, additives used as stabilizers and acid-diffusion controlling agents, coating aids such as surfactants or anti-foaming agents, adhesion promoters and plasticizers.

The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., *Introduction to Microlithography*, Eds. Thompson et al., cited previously. In addition to the above components, the photoresist compositions provided herein generally include a casting solvent to dissolve the other components so that the overall composition may be applied evenly on the substrate surface to provide a defect-free coating. Where the photoresist composition is used in a multilayer imaging process, the solvent used in the imaging layer photoresist is preferably not a solvent to the underlayer materials, otherwise the unwanted intermixing may occur. The invention is not limited to selection of any particular solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate ("EEP"), a combination of EEP and γ-butyrolactone ("GBL"), lactate esters such as ethyl lactate, alkylene glycol alkyl ether esters such as PGMEA, alkylene glycol monoalkyl esters such as methyl cellosolve, butyl acetate, and 2-ethoxyethanol. Preferred solvents include ethyl lactate, propylene glycol methyl ether acetate, ethyl 3-ethoxypropionate and their mixtures. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Greater than 50 percent of the total mass of the resist formulation is typically composed of the solvent, preferably greater than 80 percent.

Other customary additives include dyes that may be used to adjust the optical density of the formulated resist and sensitizers which enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed. Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally-derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

Typically, the sum of all customary additives will comprise less than 20 percent of the solids included in the resist formulation, preferably, less than 5 percent.

Use in Generation of Resist Images on a Substrate

The present invention also relates to a process for generating a resist image on a substrate comprising the steps of: (a) coating a substrate with a film comprising a resist composition provided herein; (b) imagewise exposing the film to radiation; and (c) developing the image. The first step involves coating the substrate with a film comprising the resist composition dissolved in a suitable solvent. Suitable substrates are ceramic, metallic or semiconductive, and preferred substrates are silicon-containing, including, for example, silicon dioxide, silicon nitride, and silicon oxynitride. The substrate may or may not be coated with an organic anti-reflective layer prior to deposition of the resist composition. Alternatively, a bilayer resist may be employed wherein a resist composition provided herein forms an upper resist layer (i.e., the imaging layer), and the underlayer is comprised of a material that is highly absorbing at the imaging wavelength and compatible with the imaging layer. Conventional underlayers include diazonaphthoquinone (DNQ)/novolak resist material.

Preferably, the surface of the substrate is cleaned by standard procedures before the film is deposited thereon. Suitable solvents for the composition are as described in the preceding section, and include, for example, cyclohexanone, ethyl lactate, and propylene glycol methyl ether acetate. The film can be coated on the substrate using art-known techniques such as spin or spray coating, or doctor blading. Preferably, before the film has been exposed to radiation, the film is heated to an elevated temperature of about 90–150° C. for a short period of time, typically on the order of about 1 minute. The dried film has a thickness of about 0.02–5.0 microns, preferably about 0.05–2.5 microns, most preferably about 0.10 to 1.0 microns. The radiation may be ultraviolet, electron beam or x-ray. Ultraviolet radiation is preferred, particularly deep ultraviolet radiation having a wavelength of less than about 250 nm, e.g., 157 nm using an $F_2$ excimer laser. The radiation is absorbed by the radiation-sensitive acid generator to generate free acid which with heating causes cleavage of the acid-cleavable pendant groups and formation of the corresponding acid. After the film has been exposed to radiation, the film may again be heated to an elevated temperature of about 90–150° C. for a short period of time, on the order of about 1 minute. It will be appreciated by those skilled in the art that the aforementioned description applies to a positive resist, and with a negative resist the exposed regions would typically be crosslinked by acid.

The third step involves development of the image with a suitable solvent. Suitable solvents include an aqueous base, preferably an aqueous base without metal ions such as the industry standard developer tetramethylammonium hydroxide or choline. Other solvents may include organic solvents or carbon dioxide (in the liquid or supercritical state), as disclosed in U.S. Pat. No. 6,665,527, to R. Allen et al., "Process for generating negative tone resist images utilizing carbon dioxide critical fluid," which is hereby incorporated by reference herein. Because the fluorinated styrene copolymer of the resist composition is substantially transparent at 157 nm, the resist composition is uniquely suitable for use at that wavelength. However, the resist may also be used with wavelengths of 248 nm, or with EUV (e.g., at 13 nm) electron beam or x-ray radiation.

The pattern from the resist structure may then be transferred to the material of the underlying substrate. Typically, the transfer is achieved by reactive ion etching or some other etching technique. Thus, the compositions provided herein and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices. Accordingly, the processes for making these features involves, after development with a suitable developer as above, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. In the manufacture of integrated circuits, circuit patterns can be formed in the exposed areas after resist development by coating the substrate with a conductive material, e.g., a metallic material, using known techniques such as evaporation, sputtering, plating, chemical vapor deposition, or laser-induced deposition. Dielectric materials may also be deposited by similar means during the process of making circuits. Inorganic ions such as boron, phosphorous, or arsenic can be implanted in the substrate in the process for making p-doped or n-doped circuit transistors. Examples of such processes are disclosed in U.S. Pat. Nos. 4,855,017, 5,362,663, 5,429,710, 5,562,801, 5,618,751, 5,744,376, 5,801,094, and 5,821,469. Other examples of pattern transfer processes are described in Chapters 12 and 13 of Moreau, *Semiconductor Lithography, Principles, Practices, and Materials* (Plenum Press, 1988). It should be understood that the invention is not limited to any specific lithographic technique or device structure.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entirety.

Experimental

The following examples are put forth so as to provide those of ordinary skill in the art with a complete disclosure and description of how to prepare and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight, temperature is in °C. and pressure is at or near atmospheric. Additionally, all starting materials were obtained commercially or synthesized using known procedures.

EXAMPLE 1

Synthesis of 4-(Hexafluorohydroxyisopropyl)styrene (SHFI)

A 5 L three-neck round-bottom flask was equipped with a mechanical stirrer, thermocouple thermometer, addition funnel with a nitrogen bubbler, and a cooling bath container. The nitrogen-flushed flask was charged with 200 mL anhydrous tetrahydrofuran, 67.5 g (2.77 mol) of magnesium turnings, and a small crystal of iodine. The addition funnel was charged with 500 g (2.73 mol) of freshly distilled 4-bromostyrene. Approximately 10 mL of 4-bromostyrene was added to the flask with vigorous stirring. As soon as the Grignard reaction was started, the flask was charged with an additional 1800 mL of anhydrous tetrahydrofuran. The remainder of the 4-bromostyrene was added dropwise to the stirred reaction at such a rate as to maintain the reaction at a temperature of 40° C. while cooling the flask with an ice/water bath. The addition required 2 hours, after which the cooling bath was removed and the reaction stirred another 1.5 hours. The reaction mixture was then cooled to 0° C. with a dry-ice/acetone bath, and the addition funnel was replaced with a gas inlet tube connected with appropriate back-flow safeguards to a cylinder of hexafluoroacetone. Hexafluoroacetone gas was passed into the reaction mixture over 2 hours while maintaining the reaction temperature below 15° C. with the cooling bath. After the reaction exotherm diminished, the gas addition was stopped. A total of 480 g (2.89 mol) hexafluoroacetone had been added. The cooling bath was removed and the reaction stirred overnight. The reaction was maintained below 10° C. as 500 mL of 6 N hydrochloric acid was added dropwise with stirring over 1 hour. The organic layer was separated and the aqueous layer extracted with three 300 mL portions of diethyl ether. The combined organic layers were washed with three 300 mL portions of brine, dried over sodium sulfate, filtered, and evaporated on the rotary evaporator. The residue was distilled under vacuum collecting fractions 58–78° C. at a vacuum of 800–300 mTorr. A total of 589 g (74%) of product containing approximately 15 mol % complexed tetrahydrofuran (THF) was obtained.

EXAMPLE 2
Preparation of α-(Trifluoromethy)acrylonitrile (TFMAN)

(a) 1,1,1-Trifluoroacetone cyanohydrin: To a stirred and cooled solution of 127.2 grams (2.6 mol) sodium cyanide in 544 mL water was added dropwise 300 grams (2.68 mol) of 1,1,1-trifluoroacetone. This solution was cooled to 4° C. and a cooled solution of 6N sulfuric acid (910 g) was added slowly with mechanical stirring keeping the temperature below 10° C. After stirring overnight at room temperature the reaction was extracted with diethyl ether, the extracts dried with sodium sulfate, filtered, and evaporated. The residue was distilled under reduced pressure (50 mm Hg) and the fractions boiling between 40–80° C. were collected and mixed with an equal volume of diethyl ether then stirred with sodium sulfate overnight. Filtration, evaporation, distillation, and sodium sulfate treatment of the residue was repeated twice to obtain 270 grams (72%) of cyanohydrin (b.p.: 76–79° C./50 mm).

(b) 1,1,1-Trifluoroacetone cyanohydrin acetate: Triethylamine (194.3 g, 1.924 mol) was added dropwise to a stirred solution of 269 grams (1.935 mol) of the cyanohydrin prepared in part (a), 202.7 grams (1.987 mol) of acetic anhydride, 320 mL of methylene chloride, and 630 milligrams of 4-dimethylaminopyridine cooled to 4° C. After stirring overnight at room temperature the reaction was diluted with 200 mL water and extracted with methylene chloride. The methylene chloride extract was dried with sodium sulfate, filtered, concentrated, and distilled. The product acetate (321 grams, 91%) was collected at 81–82° C./50 mm Hg.

(c) 2-(Trifluoromethyl)acrylonitrile: A total of 320 grams (1.7 mol) of the cyanohydrin acetate prepared in part (b) was passed in a slow stream of nitrogen through a heated (500–550° C.) glass tube packed with glass tubing pieces. The pyrolysis product was collected via trap cooled in liquid nitrogen. The crude pyrolysis product was purified by fractional distillation to yield 139 grams (65%) of pure 2-(trifluoromethyl)acrylonitrile (TFMAN). Fractions with purity greater than 99.5% (GC) were used for polymerization: bp 75–77° C. [lit. bp 75.9–76.2° C. (759 mm)]; $^1$H NMR (60 MHz, neat) δ6.62 and 6.70 (CH$_2$); $^{13}$C NMR (20 MHz, CDCl$_3$) δ112.2 (CN), 115.4 (αC) ($J_{CF}\cong$40 Hz), 120.3 (CF$_3$) ($J_{CF}$=272.5 Hz), 138.4 (CH$_2$) ($J_{CF}$=3.8 Hz).

EXAMPLE 3
Preparation of 2-(Trifluoromethyl)acrylic acid (TFMAA)

(a) 3-Hydroxy-2-(trifluoromethyl)propionic acid: 2-(Trifluoromethyl)acrylonitrile (60 grams, 0.496 mol) was added dropwise to 169 grams of sulfuric acid (1.725 mol) which was stirred mechanically and heated to 120–130° C. After the addition was complete the mixture was stirred for an additional 30 minutes at 120–130° C. The mixture was allowed to cool slightly, 170 mL of water was added, and the reaction heated for 5 hours at 120° C. The cooled reaction mixture was extracted with several portions of diethyl ether, the ether extracts washed with brine, dried with sodium sulfate, filtered and, evaporated to yield 68.5 grams (86%) of the hydroxy-acid as a colorless syrup.

(b) 2-(Trifluoromethyl)acrylic acid (TFMAA): Syrupy 3-hydroxy-2-trifluoromethyl)propionic acid (73 grams, 0.459 mol) was slowly added to 24 grams of phosphorus pentoxide (0.085 mol) while avoiding excessive heat evolution. The mixture was cautiously heated to 160–200° C. while collecting the product with an air-cooled short path distillation apparatus as it disilled from the mixture. The solid product was redistilled, collecting pure product fractions (b.p. 157–160° C.) totaling 50.5 grams (79%).

EXAMPLE 4
Preparation of Methyl α-(Trifluoromethyl)acrylate (MTFMA)

Methyl α-(trifluoromethyl)acrylate was synthesized by a modification of the method described by Buxton (1954) *J. Chem. Soc.*, p. 366, as follows: Direct methanolysis of the cyanohydrin of 1,1,1-trifluoroacetone (prepared in Example 1, part (a)) gave methyl α-hydroxy-α-(trifluoromethyl) propionate in ca. 70% yield. The α-hydroxyl group was esterified by treating the propionate with acetic anhydride, triethylamine, and 4-(dimethylamino)pyridine in methylene chloride to give methyl α-acetoxy-α-(trifluoromethyl) propionate in ca. 75% yield. Pyrolysis of the ester acetate yielded MTFMA in ca. 62% yield. After ether extraction of the crude pyrolysis product, MTFMA was purified by fractional distillation and purity assayed by gas chromatography (GC). Fractions purer than 99.5% were used for all polymerizations: bp 104–105° C. (lit. bp 103.8–105° C.; $^1$H NMR (60 MHz, CDCl$_3$) δ3.80 (CH$_3$O), 6.40 and 6.67 (CH$_2$); $^{13}$C NMR (20 MHz, CDCl$_3$) δ53.2 (CH$_3$O); 122.2 (CF$_3$) ($J_{CF}$=274 Hz), 133.2 (CH$_2$) ($J_{CF}\cong$5 Hz), 133.2 (αC), ($J_{CF}\cong$50 Hz), 162.7 (C=O).

EXAMPLE 5
Preparation of t-Butyl 2-(trifluoromethyl)acrylate (TBTFMA)

Oxalyl chloride (87.3 g, 0.68 mol) was added to a solution of 2-(trifluoromethyl)acrylic acid (TFMAA) (15.0 g, 0.11 mol) in methylene chloride (90 mL) in a dropwise manner at room temperature under an nitrogen atmosphere. The solution was heated to reflux for 5 hours, and the solvent and excess reagent were removed on a rotary evaporator. The resulting acid chloride was added to a stirred solution consisting of t-butanol (44 g, 0.59 mmol) and pyridine (33.6 g, 0.42 mol) in methylene chloride at 0° C. over a 10 min period. After stirring overnight at room temperature, the solution was neutralized with diluted aqueous HCl and washed with saturated aqueous sodium bicarbonate. The organic phase was removed, and the aqueous phase was extracted with pentane. The combined organic solvents were reduced to a small volume by distillation and then the residue was chromatographed on a column of silica gel. The product was re-purified by distillation to give 14.0 g of TBTFMA as a colorless liquid (70%).

EXAMPLE 6

Synthesis of poly{4-(Hexafluorohydroxyisopropyl)styrene-co-t-butyl methacrylate}

A 100 mL three-neck round-bottom flask was equipped with a magnetic stirrer, condenser with nitrogen bubbler, and temperature controlled heating mantle. The flask was charged with 15 g of 4-(Hexafluorohydroxyisopropyl)styrene (0.0528 mol) (containing ca 5 wt % THF), 4.26 g (0.0299 mol) of t-butyl methacrylate, and 48 mL of ethyl acetate. The reaction was nitrogen flushed and heated to 70° C., then 561 mg (3.42 mmol) of 2,2'-azobisisobutyronitrile (AIBN) was added, the reaction again nitrogen flushed, and heated overnight at reflux. The reaction mixture was cooled to room temperature then precipitated in 2500 mL hexane. The solid product was collected by filtration and washed with three 200 mL portions of hexane. After drying overnight under high vacuum 17.6 grams of polymer was obtained. $M_w=12,800$. $T_g=135°$ C.

EXAMPLE 7

Synthesis of High Molecular Weight poly(TBTFMA-co-SHFI)

A mixture of t-butyl α-trifluoromethylacrylate or "TBTFMA" (3.40 g, 17.7 mmol) and SHFI-THF complex (18 mol % of THF, 13.0 g, 41.3 mmol), and azobisisobutyronitrile (AIBN) (3.50 mol % to monomers) in 12 mL of previously degassed ethyl acetate was degassed by bubbling nitrogen for 15 min at 15° C. The reaction mixture was warmed to room temperature and stirred at 75° C. in an oil bath in a nitrogen atmosphere for 18 hrs. The mixture was decanted into water, and the organic solvent was removed by a rotor evaporator. The resulting glue-like material was dried at 60° C. under vacuum for 2–3 hrs and re-dissolved in 20 mL of methanol, precipitated in a mixture of methanol and water (1:3 v/v). The precipitate was filtered, washed with the solvent mixture, and dried at 60° C. under vacuum overnight to give 10 g of a white polymer containing 25 mol % TBTFMA. $M_n=26,900$ and $M_w=39,400$. $T_g=135°$ C.

EXAMPLE 8

Synthesis of Low Molecular Weight poly(TBTFMA-co-SHFI)

A mixture of TBTFMA (0.62 g, 3.16 mmol) and SHFI-THF complex (16.0 mol % of THF, 2.03 g, 7.14 mmol), and AIBN (8.00 mol % to monomers) in 5 mL of previously degassed ethyl acetate was degassed by bubbling nitrogen for 15 min at 15° C. The reaction mixture was warmed to room temperature and stirred at 85° C. in an oil bath in a nitrogen atmosphere for 24 hrs. The mixture was decanted into water and the organic solvent was removed by a rotor evaporator. The resulting glue-like material was dried at 60° C. under vacuum for 2–3 hrs and re-dissolved in 20 mL of methanol, precipitated in a mixture of methanol and water (1:3 v/v). The precipitate was filtered, washed with the solvent mixture, and dried at 60° C. under vacuum overnight to give 2.07 g of a white polymer containing 27 mol % TBTFMA. $M_w=3,600$ and $M_w=6,400$.

EXAMPLE 9

Terpolymer of 4-(Hexafluorohydroxyisopropyl)styrene, t-butyl 2-trifluoromethylacrylate, and α-(trifluoromethyl)acrylonitrile A 100 mL three-neck round-bottom flask was equipped with a magnetic stirrer, temperature-controlled heating mantle, thermocouple thermometer, and Friedrichs condenser with a nitrogen bubbler gas inlet. The flask was charged with: 4-(Hexafluorohydroxyisopropyl)styrene (10.86 g, 0.037 mol; contains 8 wt % THF), α-(trifluoromethyl)acrylonitrile (2.24 g, 0.0185 mol), t-butyl 2-trifluoromethylacrylate (7.25 g, 0.037 mol), and 35 mL of ethyl acetate. The mixture was purged with nitrogen, then heated to 70–75° C. with stirring. To the stirred mixture was added 2,2'-azobisisobutyronitrile (0.607 g, 0.0037 mol), the mixture was nitrogen flushed and maintained at 70–75° C. for 19 hours. The heat was removed and the mixture allowed to cool to room temperature before being added dropwise to 2.5 L of stirred hexanes. The precipitated polymer was filtered and washed on the funnel with three 150 mL portions of hexanes. The solid was dried overnight in a vacuum oven at 60° C. and an ultimate vacuum of less than 500 milliTorr, to obtain 16.3 grams of terpolymer.

EXAMPLE 10

Terpolymer of 4-(Hexafluorohydroxyisopropyl)styrene, t-butyl 2-trifluoromethylacrylate, and hexafluoroisopropyl methacrylate Using the same apparatus and process as described in Example 9 above, a mixture of: 4-(Hexafluorohydroxyisopropyl)styrene (10.86 g, 0.037 mol; contains 8 wt % THF), hexafluoroisopropyl methacrylate (3.94 g, 0.0148 mol), t-butyl 2-trifluoromethylacrylate (4.355 g, 0.0222 mol), 30 mL of ethyl acetate, and 2,2'-azobisisobutyronitrile (0.486 g, 0.00296 mol) was polymerized. After precipitation in hexanes and vacuum drying, 16.21 grams of terpolymer was obtained.

EXAMPLE 11

Terpolymer of 4-(Hexafluorohydroxyisopropyl)styrene, t-butyl 2-trifluoromethylacrylate, and isobornyl methacrylate Using the same apparatus and process as described in Example 9 above, a mixture of: 4-(Hexafluorohydroxyisopropyl)styrene (10.86 g, 0.037 mol; contains 8 wt % THF), isobornyl methacrylate (0.823 g, 0.0037 mol), t-butyl 2-trifluoromethylacrylate (6.53 g, 0.0333 mol), 30 mL of ethyl acetate, and 2,2'-azobisisobutyronitrile (0.486 g, 0.00296 mol) was polymerized. After precipitation in hexanes and vacuum drying, 15.31 grams of terpolymer was obtained.

EXAMPLE 12

Figure 1:
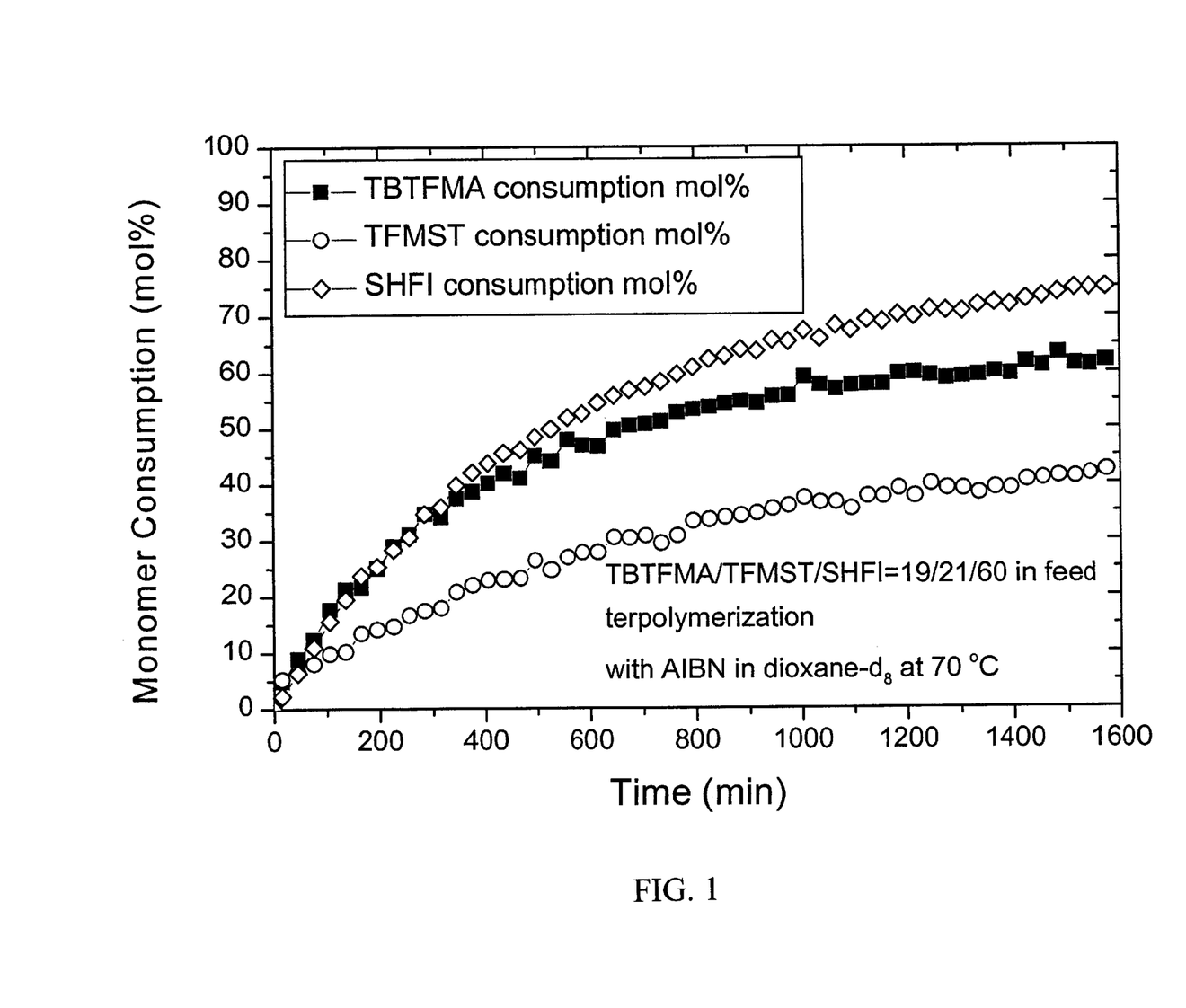
FIG. 1 illustrates monomer consumption data for the terpolymerization of SHFI (4-(Hexafluorohydroxyisopropyl)styrene), TBTFMA (t-butyl α-trifluoromethylacrylate), and TFMST (α-trifluoromethylstyrene).

FIG. 1 shows monomer consumption kinetics in the terpolymerization of SHFI/TBTFMA/TFMST (60/19/21 mol. %, respectively), with 2, 2'-azobisisobutyronitrile (AIBN) in dioxane-$d_8$ at 70 C. The composition of the terpolymer produced after about 24 hrs. was SHFI/TBTFMA/TFMST=68/18/14 (mol. %). These polymerization kinetic data were made using in situ $^1$H NMR. The use of TFMST in terpolymerization can also improve dry etch resistance; α-Trifluoromethylacrylonitrile can play a similar role as a third monomer.

EXAMPLE 13

A resist was formulated from a 50/50 copolymer of 4-(Hexafluorohydroxyisopropyl)styrene and t-butyl-α-trifluoromethyl acrylate (referred to as Polymer A). The resist formulation used PGMEA as a solvent. The components of the formulation were as follows:

Polymer A: 100 parts

Photoacid generator: bis-(t-butylphenyl)iodonium perfluorooctanesulfonate: 6 parts Base: tetrabutylammonium hydroxide: 0.15 parts The resist was spin-coated onto a silicon wafer, soft baked at 130C./1 minute, exposed to DUV (248 nm) light, post-exposure baked (PEB) at 140C./90 seconds, developed in 0.26N tetramethylammonium hydroxide ("TMAH", a standard developer) for 60 seconds. High quality 0.25 micron images (lines/spaces) were printed over a substantial dose and focus range.

EXAMPLE 14

A resist was formulated from the polymer identified as Polymer A in Example 13 (see above). The resist formulation used PGMEA as a solvent. The components of the formulation were as follows:

Polymer A: 100 parts

Dissolution Modifying Additive: A fluorinated, low molecular weight compound with acid labile groups attached: 12 parts Photoacid generator: bis-(t-butylphenyl)iodonium perfluorooctanesulfonate: 6 parts Base: tetrabutylammonium hydroxide: 0.15 parts The resist was spin-coated onto a silicon wafer, soft baked at 130C./1 minute, exposed to DUV (248 nm) light, post-exposure baked (PEB) at 140C./90 seconds, developed in 0.26N TMAH (standard developer) for 60 seconds. High quality 0.25 micron images (lines/spaces) were printed over a substantial dose and focus range larger than those given in Example 1.

EXAMPLE 15

Resist Formulation and Lithographic Imaging

Poly(TBMA-co-SHFI) was dissolved in propylene glycol monomethyl ether acetate (PGMEA) at 10 wt %, to which was added di-4-t-butylphenyliodonium perfluorobutanesulfonate (3.3 wt % of polymer). Spin-cast films were baked at 130° C. for 60 sec. Post-exposure bake was carried out at 140° C. for 60 sec. The area of the wafer fully exposed to deep UV radiation exhibited a very fast dissolution rate of 24,000 A/sec ($R_{max}$) in a 0.26 N tetramethylammonium hydroxide(TMAH) solution (CD-26 in this case). The dose to clear was 3.5 mJ/cm$^2$ at 248 nm and <1.0 mJ/cm$^2$ at 157 nm. The resist (250 nm thick) printed 250 nm line-space patterns at 12 mJ/cm$^2$ with a large depth of focus on a low numerical aperture (NA 0.42) 248 nm KrF excimer laser stepper even without adding a base quencher. High resolution images down to 160 nm printed in a thin (140 nm) and thick (250 nm) poly(4-Hexafluorohydroxyisopropyl) styrene-co-t-butyl methacrylate) resist on a 0.6 NA KrF excimer laser stepper were obtained. No quencher was used in this formulation.

What is claimed is:

1. A copolymer prepared by copolymerization of at least one aromatic monomer having the structure of formula (I)

(I)

and at least one monomer having the structure of formula (II)

(II)

wherein:
  m is zero or 1;
  n is an integer in the range of zero through 4 inclusive;
  $R_1$ is H, F, lower alkyl, or fluorinated lower alkyl;
  $R_2$ is alkyl, fluorinated alkyl, hydroxyl, alkoxy, fluorinated alkoxy, halogen, or cyano;
  $R_3$ is a fluorinated alkyl;
  $R_4$ is H, alkyl, or fluorinated alkyl;
  $R_5$ is H, alkyl, protected hydroxyl, —C(O)R$_8$, —CH$_2$—C(O)OR$_8$, —C(O)OR$_9$, or —SiR$_{10}$ where R$_8$ is H or alkyl, R$_9$ is alkyl, and R$_{10}$ is alkyl or alkoxy;
  $R_6$ is H, F, lower alkyl, or fluorinated lower alkyl;
  $R_7$ is selected from the group consisting of H, an acid-labile moiety optionally substituted with one or more fluorine atoms, and an acid inert moiety optionally substituted with one or more fluorine atoms;
  L is a hydrocarbylene linking group optionally substituted with one or more fluorine atoms; and
  Ar is an aromatic moiety.

2. The copolymer of claim 1, wherein:
  m is zero or 1;
  n is zero, 1 or 2;
  $R_1$ is H, methyl, or trifluoromethyl;
  $R_2$ is lower alkyl, fluorinated lower alkyl, hydroxyl, lower alkoxy, fluorinated lower alkoxy, halogen, or cyano;
  $R_3$ is fluorinated lower alkyl;
  $R_4$ is H, lower alkyl, or fluorinated lower alkyl;
  $R_5$ is H, lower alkyl, t-butyloxycarbonyl, —C(O)R$_8$, —CH$_2$—C(O)OR$_8$, —C(O)OR$_9$, or —SiR$_{10}$ where R$_8$ is H or lower alkyl, R$_9$ is lower alkyl, and R$_{10}$ is lower alkyl or lower alkoxy;
  $R_6$ is H, F, lower alkyl, or fluorinated lower alkyl;
  $R_7$ is H or an acid-cleavable moiety;
  L is an alkylene linking group optionally substituted with one or more fluorine atoms; and
  Ar is monocyclic or bicyclic.

3. The copolymer of claim 2, wherein:
  n is zero or 1;
  $R_1$ is H, methyl, or trifluoromethyl;
  $R_2$ is fluorinated lower alkyl, hydroxyl, lower alkoxy, fluorinated lower alkoxy, or halogen;

$R_3$ is trifluoromethyl;

$R_4$ is H, methyl, or trifluoromethyl;

$R_5$ is H or t-butyloxycarbonyl;

$R_6$ is H, methyl, or trifluoromethyl;

$R_7$ is an acid-cleavable moiety selected from the group consisting of tertiary alkyl substituents and $C_6$–$C_{12}$ cyclic and alicyclic substituents with a tertiary attachment point; and L is a lower alkylene linking group optionally substituted with one or more fluorine atoms.

4. The copolymer of claim 3, wherein:

$R_1$ is H;

$R_2$ is halogen;

$R_7$ is an acid-cleavable moiety selected from the group consisting of t-butyl, adamantyl, norbornyl, isobornyl, 2-methyl-2-adamantyl, 2-methyl-2-isobornyl, 2-methyl-2-tetracyclo-dodecenyl and 1-methylcyclohexyl; and L is selected from the group consisting of —$CH_2$—, —$CH_2$—$CH_2$—, —CH=CH—, —$CF_2$—, $CF_2$—$CF_2$—, —CF=CF—, —$OCH_2$—, and —$SCH_2$—, with the proviso that if L is —$OCH_2$— or —$SCH_2$—, the oxygen or sulfur atom is not adjacent to the $CR_3R_4$ moiety.

5. The copolymer of claim 4, wherein:

m is zero;

$R_2$ is fluoro; and $R_7$ is t-butyl.

6. The copolymer of claim 5, wherein n is zero.

7. The copolymer of claim 1, wherein the monomer having the structure of formula (II) is 4-(hexafluorohydroxyisopropyl)styrene.

8. The copolymer of claim 1, prepared by copolymerization of two or more monomers having the structure of formula (I) and at least one monomer having the structure of formula (II).

9. The copolymer of claim 1, prepared by copolymerization of two or more monomers having the structure of formula (II) and at least one monomer having the structure of formula (I).

10. The copolymer of claim 1, prepared by copolymerization of two or more monomers having the structure of formula (I) and two or more monomers having the structure of formula (II).

11. The copolymer of claim 1, prepared by copolymerization of at least one monomer having the structure of formula (I), at least one monomer having the structure of formula (II), and at least one additional monomer not having the structure of formula (I) or formula (II).

12. The copolymer of claim 11, wherein the at least one additional monomer is acid inert.

13. The copolymer of claim 12, wherein the at least one additional monomer is a radically copolymerizable vinyl monomer.

14. The copolymer of claim 12, wherein the at least one additional monomer does not contain any fluorine substituents.

15. The copolymer of claim 14, wherein the at least one additional monomer is selected from the group consisting of styrene, acrylonitrile, methacrylonitrile, and combinations thereof.

16. The copolymer of claim 12, wherein the at least one additional monomer is fluorine-containing.

17. The copolymer of claim 16, wherein the at least one additional monomer is selected from the group consisting of $CF_2$=$CF_2$, $(CF_3)_2C$=$CF_2$, $(CF_3)_2C$=$C(CF_3)_2$, $(CF_3)CH$=$CH(CF_3)$, α-trifluoromethylstyrene (TFMST), α-trifluoromethylacrylonitrile (TFMAN), and combinations thereof.

18. The copolymer of claim 17, wherein the at least one additional monomer is selected from the group consisting of $CF_2$=$CF_2$, TFMST and TFMAN.

19. A copolymer comprised of at least one aromatic monomer unit having the structure of formula (III)

$$\begin{array}{c} R_1 \\ | \\ -(CH_2-C)- \\ | \\ Ar-(R_2)_n \\ | \\ (L)_m \\ | \\ R_3-C-R_4 \\ | \\ OR_5 \end{array} \quad (III)$$

and at least one monomer unit having the structure of formula (IV)

$$\begin{array}{c} R_6 \\ | \\ -(CH_2-C)- \\ | \\ C \\ \diagup \diagdown \\ O \quad OR_7 \end{array} \quad (IV)$$

wherein:

m is zero or 1;

n is an integer in the range of zero through 4 inclusive;

$R_1$ is H, F, lower alkyl, or, alkoxy, fluorinated alkoxy, halogen, or cyano; fluorinated lower alkyl;

$R_2$ is alkyl, fluorinated alkyl, hydroxyl $R_3$ is a fluorinated alkyl;

$R_4$ is H, alkyl, or fluorinated alkyl;

$R_5$ is H, alkyl, protected hydroxyl, —$C(O)R_8$, —$CH_2$—$C(O)OR_8$, —$C(O)OR_9$, or —$SiR_{10}$ where $R_8$ is H or alkyl, $R_9$ is alkyl, and $R_{10}$ is alkyl or alkoxy;

$R_6$ is H, F, lower alkyl, or fluorinated lower alkyl;

$R_7$ is selected from the group consisting of H, an acid-labile moiety optionally substituted with one or more fluorine atoms, and an acid inert moiety optionally substituted with one or more fluorine atoms;

L is a hydrocarbylene linking group optionally substituted with one or more fluorine atoms; and Ar is an aromatic moiety.

20. The copolymer of claim 19, wherein:

m is zero or 1;

n is zero, 1 or 2;

$R_1$ is H, methyl, or trifluoromethyl;

$R_2$ is lower alkyl, fluorinated lower alkyl, hydroxyl, lower alkoxy, fluorinated lower alkoxy, halogen, or cyano;

$R_3$ is fluorinated lower alkyl;

$R_4$ is H, lower alkyl, or fluorinated lower alkyl;

$R_5$ is H, lower alkyl, t-butyloxycarbonyl, —$C(O)R_8$, —$CH_2$—$C(O)OR_8$, —$C(O)OR_9$, or —$SiR_{10}$ where $R_8$ is H or lower alkyl, $R_9$ is lower alkyl, and $R_{10}$ is lower alkyl or lower alkoxy;

$R_6$ is H, F, lower alkyl, or fluorinated lower alkyl;

$R_7$ is H or an acid-cleavable moiety;

L is an alkylene linking group optionally substituted with one or more fluorine atoms; and Ar is monocyclic or bicyclic.

21. The copolymer of claim 20, wherein:

n is zero or 1;

$R_1$ is H, methyl, or trifluoromethyl;

$R_2$ is fluorinated lower alkyl, hydroxyl, lower alkoxy, fluorinated lower alkoxy, or halogen;

$R_3$ is trifluoromethyl;

$R_4$ is H, methyl, or trifluoromethyl;

$R_5$ is H or t-butyloxycarbonyl;

$R_6$ is H, methyl, or trifluoromethyl;

$R_7$ is an acid-cleavable moiety selected from the group consisting of tertiary alkyl substituents and $C_6$–$C_{12}$ cyclic and alicyclic substituents with a tertiary attachment point; and L is a lower alkylene linking group optionally substituted with one or more fluorine atoms.

22. The copolymer of claim 21, wherein:

$R_1$ is H;

$R_2$ is halogen;

$R_7$ is an acid-cleavable moiety selected from the group consisting of t-butyl, adamantyl, norbornyl, isobornyl, 2-methyl-2-adamantyl, 2-methyl-2-isobornyl, 2-methyl-2-tetracyclo-dodecenyl and 1-methylcyclohexyl; and L is selected from the group consisting of —$CH_2$—, —$CH_2$—$CH_2$—, —CH=CH—, —$CF_2$—, $CF_2$—$CF_2$—, —CF=CF—, —$OCH_2$—, and —$SCH_2$—, with the proviso that if L is —$OCH_2$— or —$SCH_2$—, the oxygen or sulfur atom is not adjacent to the $CR_3R_4$ moiety.

23. The copolymer of claim 22, wherein:

m is zero;

$R_2$ is fluoro; and $R_7$ is t-butyl.

24. The copolymer of claim 23, wherein n is zero.

25. The copolymer of claim 19, wherein the monomer unit having the structure of formula (III) is 4-(hexafluorohydroxyisopropyl)styrene.

26. The copolymer of claim 19, comprising two or more monomer units having the structure of formula (III) and at least one monomer unit having the structure of formula (IV).

27. The copolymer of claim 19, comprising two or more monomer units having the structure of formula (IV) and at least one monomer unit having the structure of formula (III).

28. The copolymer of claim 19, comprising two or more monomer units having the structure of formula (III) and two or more monomer units having the structure of formula (IV).

29. The copolymer of any one of claim 19, comprising at least one monomer unit having the structure of formula (III), at least one monomer having the structure of formula (IV), and at least one additional monomer unit not having the structure of formula (III) or formula (IV).

30. The copolymer of claim 29, wherein the at least one additional monomer unit is acid inert.

31. The copolymer of claim 30, wherein the at least one additional monomer unit is derived from a radically copolymerizable vinyl monomer.

32. The copolymer of claim 30, wherein the at least one additional monomer unit does not contain any fluorine substituents.

33. The copolymer of claim 32, wherein the at least one additional monomer is selected from the group consisting of styrene, acrylonitrile, methacrylonitrile, and combinations thereof.

34. The copolymer of claim 30, wherein the at least one additional monomer is fluorine-containing.

35. The copolymer of claim 34, wherein the at least one additional monomer is selected from the group consisting of $CF_2$=$CF_2$, $(CF_3)_2C$=$CF_2$, $(CF_3)_2C$=$C(CF_3)_2$, $(CF_3)CH$=$CH(CF_3)$, α-trifluoromethylstyrene (TFMST), α-trifluoromethylacrylonitrile (TFMAN), and combinations thereof.

36. The copolymer of claim 35, wherein the at least one additional monomer is selected from the group consisting of $CF_2$=$CF_2$, TFMST and TFMAN.

37. A photoresist composition, comprising:

a copolymer of claim 19; and a radiation-sensitive acid generator.

38. The photoresist composition of claim 37, further comprising a dissolution modifying additive.

39. The photoresist composition of claim 38, wherein the dissolution modifying additive is a dissolution inhibitor.

40. The photoresist composition of claim 37, further comprising a solvent.

41. The photoresist composition of claim 37, further comprising at least one additive selected from the group consisting of dyes, sensitizers, stabilizers, acid diffusion controlling agents, surfactants, anti-foaming agents, adhesion promoters, and plasticizers.

42. The photoresist composition of claim 37, wherein the radiation-sensitive acid generator is an onium salt.

43. The photoresist composition of claim 42, wherein the onium salt is iodonium perfluorooctanesulfonate.

44. The photoresist composition of claim 37, wherein the copolymer is substantially transparent to ultraviolet radiation of a predetermined wavelength.

45. The photoresist composition of claim 44, wherein the predetermined wavelength is 157 nm.

46. A process for generating a resist image on a substrate, comprising:

(a) coating a substrate with a film of a photoresist comprised of: (i) the copolymer of claim 19; and (ii) a radiation-sensitive acid generator;

(b) exposing the film selectively to a predetermined pattern of radiation so as to form a latent, patterned image in the film; and (c) developing the latent image with a developer.

47. The process of claim 46, wherein the radiation is electron-beam, x-ray, or ultraviolet radiation.

48. The process of claim 47, wherein the radiation is ultraviolet radiation.

49. The process of claim 48, wherein the ultraviolet radiation has a wavelength of less than 250 nm.

50. The process of claim 49, wherein the ultraviolet radiation has a wavelength of 157 nm.

51. A method of forming a patterned material structure on a substrate, the material being selected from the group consisting of semiconductors, ceramics and metals, the method comprising:

(a) providing a substrate having a surface comprised of said material;

(b) applying a resist composition to the substrate surface to form a resist layer over said material, the resist composition comprising the copolymer of claim 19 and a radiation-sensitive acid generator;

(c) patternwise exposing the resist to radiation whereby acid is generated by the radiation-sensitive acid generator in exposed regions of the resist layer;

(d) contacting the resist with a developer solution, whereby the developed regions of the resist layer reveal a patterned resist structure; and (e) transferring the resist structure pattern to the material by etching into said material through spaces in the resist structure.

52. The method of claim 51, wherein the radiation is electron-beam, x-ray, or ultraviolet radiation.

53. The method of claim 52, wherein the radiation is ultraviolet radiation.

54. The method of claim 53, wherein the ultraviolet radiation has a wavelength of less than 250 nm.

55. The method of claim 54, wherein the ultraviolet radiation has a wavelength of 157 nm.

56. A copolymer comprised of at least one aromatic monomer unit having the structure of formula (III)

(III)

at least one monomer unit having the structure of formula (IV)

and at least one additional monomer unit not having the structure of formula (III) or formula (IV), wherein:

m is zero or 1;
n is an integer in the range of zero through 4 inclusive;
$R_1$ is H, F, lower alkyl, or, alkoxy, fluorinated alkoxy, halogen, or cyano; fluorinated lower alkyl;
$R_2$ is alkyl, fluorinated alkyl, hydroxyl
$R_3$ is a fluorinated alkyl;
$R_4$ is H, alkyl, or fluorinated alkyl;
$R_5$ is H, alkyl, protected hydroxyl, —C(O)$R_8$, —CH$_2$—C(O)OR$_8$, —C(O)OR$_9$, or —SiR$_{10}$ where $R_8$ is H or alkyl, $R_9$ is alkyl, and $R_{10}$ is alkyl or alkoxy;
$R_6$ is H, F, lower alkyl, or fluorinated lower alkyl;
$R_7$ is selected from the group consisting of H, an acid-labile moiety optionally substituted with one or more fluorine atoms, and an acid inert moiety optionally substituted with one or more fluorine atoms;
L is a hydrocarbylene linking group optionally substituted with one or more fluorine atoms; and
Ar is an aromatic moiety, and
wherein the copolymer has molar fractions of the monomer units (II) and (IV) in the range of approximately 0.1 to 0.9 and 0.9 to 0.1, respectively, with the molar fraction of said additional monomer unit(s) in the range of zero to approximately 0.25.

* * * * *

UNITED STATES PATENT AND TRADEMARK OFFICE
CERTIFICATE OF CORRECTION

PATENT NO. : 6,610,456 B2
APPLICATION NO. : 09/794466
DATED : August 26, 2003
INVENTOR(S) : Robert David Allen et al.

It is certified that error appears in the above-identified patent and that said Letters Patent is hereby corrected as shown below:

Claim 19, column 26, lines 36-37: after "lower alkyl, or"
    delete ", alkoxy, fluorinated alkoxy, halogen, or cyano;"
Claim 19, column 26, line 38: after "hydroxyl"
    insert --, alkoxy, fluorinated alkoxy, halogen, or cyano;--

Claim 56, column 30, lines 13-14: after "lower alkyl, or"
    delete ", alkoxy, fluorinated alkoxy, halogen, or cyano;"
Claim 56, column 30, line 15: after "hydroxyl"
    insert --, alkoxy, fluorinated alkoxy, halogen, or cyano;--

Claim 56, column 30, ine 29: delete "(II)" and replace it with --(III)--

Signed and Sealed this

Twenty-first Day of November, 2006

JON W. DUDAS
*Director of the United States Patent and Trademark Office*